United States Patent [19]

Ems et al.

[11] Patent Number: 4,482,826

[45] Date of Patent: Nov. 13, 1984

[54] PROGRAMMABLE DELAY DEVICE

[75] Inventors: Stephen C. Ems, Sloatsberg; Brian M. Yamrone, Ardsley, both of N.Y.

[73] Assignee: LeCroy Research Systems Corporation, Spring Valley, N.Y.

[21] Appl. No.: 349,051

[22] Filed: Feb. 16, 1982

[51] Int. Cl.³ .................................. H03K 5/159
[52] U.S. Cl. .................... 307/602; 307/494; 307/594
[58] Field of Search ............ 307/481, 482, 494–498, 307/594, 602, 603

[56] References Cited

U.S. PATENT DOCUMENTS

| | | | |
|---|---|---|---|
| 3,673,438 | 6/1972 | Lund | 307/594 |
| 3,976,893 | 8/1976 | Banfi | 307/597 |
| 4,129,792 | 12/1978 | Kawagai et al. | 307/595 |
| 4,296,338 | 10/1981 | Thomas | 307/594 |
| 4,339,672 | 7/1982 | Sato | 307/482 |
| 4,379,974 | 4/1983 | Plachmo | 307/597 |

OTHER PUBLICATIONS

Richman, P., *Characteristics and Operation of MOS Field Effect Devices*, McGraw-Hill, 1967, pp. 114–118.

*Primary Examiner*—Stanley D. Miller
*Assistant Examiner*—B. P. Davis
*Attorney, Agent, or Firm*—Curtis, Morris & Safford

[57] ABSTRACT

A programmable delay circuit is formed of at least one channel of cascaded, directly coupled inverter elements, the at least one channel including a power supply terminal to which a controllable operating voltage is supplied. The overall time delay exhibited by the at least one channel is a function of the magnitude of the operating voltage supplied to the power supply terminal and the number of cascaded inverter elements included therein. A desired time delay may be established by generating a voltage representing the actual time delay exhibited by the channel, comparing the generated voltage and a reference voltage representing the desired delay, and adjusting the magnitude of the operating voltage supplied to the power supply terminal as a function of the difference between the compared voltages. In a preferred embodiment, the programmable delay circuit includes at least one data channel and a reference channel, the reference channel being used to generate the aforementioned voltage representing the actual time delay exhibited by the at least one data channel.

16 Claims, 6 Drawing Figures

PROGRAMMABLE DELAY DEVICE

BACKGROUND OF THE INVENTION

This invention relates to a delay circuit and, more particularly, to a programmable delay circuit which is formed of directly coupled inverter elements and which may be constructed as an integrated circuit chip.

Delay circuits are known for establishing a desired time delay to an input electrical signal. Such delay circuits may be characterized as analog delay circuits, such as a coaxial line whose delay is determined by the length of that line, and digital delay circuits, such as cascaded monostable multivibrators, shift registers, or the like, which are capable of imparting delays to pulse signals as a function of the number of such cascaded circuits, the frequency of timing pulses supplied thereto, and the like. While coaxial lines generally provide desirable time delays, such lines often must be of unwieldy lengths, and generally are extremely inconvenient for practical applications. Also, they tend to distort and attenuate the signal which is delayed thereby. Other time delay circuits have been introduced, such as glass delay lines, multi-channel "lumped" delay lines, and the like. However, in these devices, the time delays often are too large for many applications; and inherent time delays thereof are not easily adjusted, or modified. Furthermore, interference due to temperature dependency generally is not easily corrected.

The time delays produced by cascaded monostable multivibrators are a function of the inherent time delay of each such multivibrator. Typically, when such cascaded multivibrators are used to impart a time delay to an input pulse signal, successive pulse signals are spaced apart by a time difference that is at least equal to the overall time delay exhibited by the cascaded multivibrators. This limits the pulse separation which can be used with such delay circuits. Furthermore, the overall temperature dependency of such cascaded multivibrators is relatively high because each individual multivibrator is itself temperature dependent, thus resulting in cumulative temperature-related errors.

The use of a shift register as a time delay circuit also suffers from disadvantages. A shift register generally imparts a time delay to a pulse signal by loading that pulse signal into the shift register in response to a clock pulse, and shifting that pulse signal through the shift register in response to successive clock pulses. The delay exhibited by such a shift register time delay circuit is, thus, a function of the periodicity of the clock pulses and the number of stages included in the shift register. However, since the shift register is loaded in synchronism with the clock pulses, any deviation or time-displacement of the input pulse signal relative to the clock pulses is eliminated. Thus, if the integrity of the relative time of occurrence of such a pulse signal is to be preserved, the use of shift register time delay circuits has a tendency to distort that integrity.

Recently, charge coupled devices (CCD) have been proposed for use as time delay circuits. In a typical charge coupled device, such as a bucket brigade delay line, MOS components are cascaded. Field effect transistors (FETs) function as switches, and such switch-type FETs alternate with FET amplifiers whose gate electrodes exhibit inherent capacitance that is used as a storage device. In operation, a switch-type FET opens to pass an input signal, such as a pulse sample, to be stored at the gate electrode of the next-following FET amplifier. Then, the first switch-type FET is closed and the next-following switch-type FET is opened so as to pass the signal which had been stored at the gate electrode of the FET amplifier. In this manner, successive switches are opened alternately, and in sequence, so as to "ripple" the sampled signal from one FET amplifier to the next. The overall delay of this CCD is a function of the number of FET amplifier stages, the number of FET switches, and the frequency, or periodicity, of the clock signals which are used to open the FET switches in sequence. Generally, the overall delay may be too large for many applications. Also, the delay exhibited by such CCD circuits is not easily controlled, modified or adjusted; and substantially different delays may be exhibited by what otherwise appears to be two identical CCD circuits.

OBJECTS OF THE INVENTION

Therefore, it is an object of the present invention to provide an improved delay circuit which overcomes the aforenoted disadvantages.

Another object of this invention is to provide a programmable delay circuit which exhibits an overall time delay which may be adjusted, as desired, so as to compensate for any changes therein which might be attributed to temperature-dependent characteristics.

A further object of this invention is to provide a programmable semiconductor delay device whose overall time delay may be programmed, as desired.

An additional object of this invention is to provide a multi-channel programmable delay device which is capable of exhibiting substantially equal delays in several delay channels.

Yet another object of this invention is to provide an improved programmable delay circuit having at least one channel which imparts a time delay to an input pulse signal, which delay may be set and controlled as desired.

A still further object of this invention is to provide a programmable delay circuit which may be constructed as an integrated circuit chip, and which may be provided with a plurality of delay channels, all of which channels may be controlled to exhibit substantially the same time delay.

Another object of this invention is to provide a programmable delay circuit capable of imparting time delays on the order of several hundred nanoseconds to several microseconds, and capable of propagating successive, narrow pulses which are closely spaced apart from each other.

Various other objects, advantages and features of the present invention will become readily apparent from the ensuing detailed description, and the novel features will be particularly pointed out in the appended claims.

SUMMARY OF THE INVENTION

In accordance with this invention, a programmable delay circuit is provided with at least one channel of cascaded, directly coupled inverter elements. The at least one channel includes a power supply terminal for supplying an operating voltage to the inverter elements, the operating voltage being controlled so that the at least one channel establishes an overall time delay as function of the magnitude of the operating voltage supplied thereto. In a preferred embodiment, the delay circuit includes a plurality of data channels and, preferably, a reference channel, each channel being formed of cascaded semiconductor amplifier elements. The delay of each data channel is set by detecting the actual time delay imparted thereby, as represented by the actual time delay imparted to an input signal by the reference channel, and sensing the difference between this actual time delay and a desired time delay. The sensed difference is used to adjust the operating voltage that is supplied to the power supply terminals of the respective data and reference channels. Advantageously, the data and reference channels may be constructed as an integrated circuit chip formed of, for example, directly coupled MOS, I$^2$L or ECL inverter elements, or stages.

As used herein, the expression "directly coupled inverter elements" is intended to mean that successive inverter elements, such as successive MOS transistor amplifiers or FETs, or successive I$^2$L or ECL inverter stages or the like, are directly connected to each other without the intermediary of switching elements from one stage to the next.

BRIEF DESCRIPTION OF THE DRAWINGS

The following detailed description, given by way of example, will best be understood in conjunction with the accompanying drawings in which.

DETAILED DESCRIPTION OF CERTAIN PREFERRED EMBODIMENTS

Figure 1:
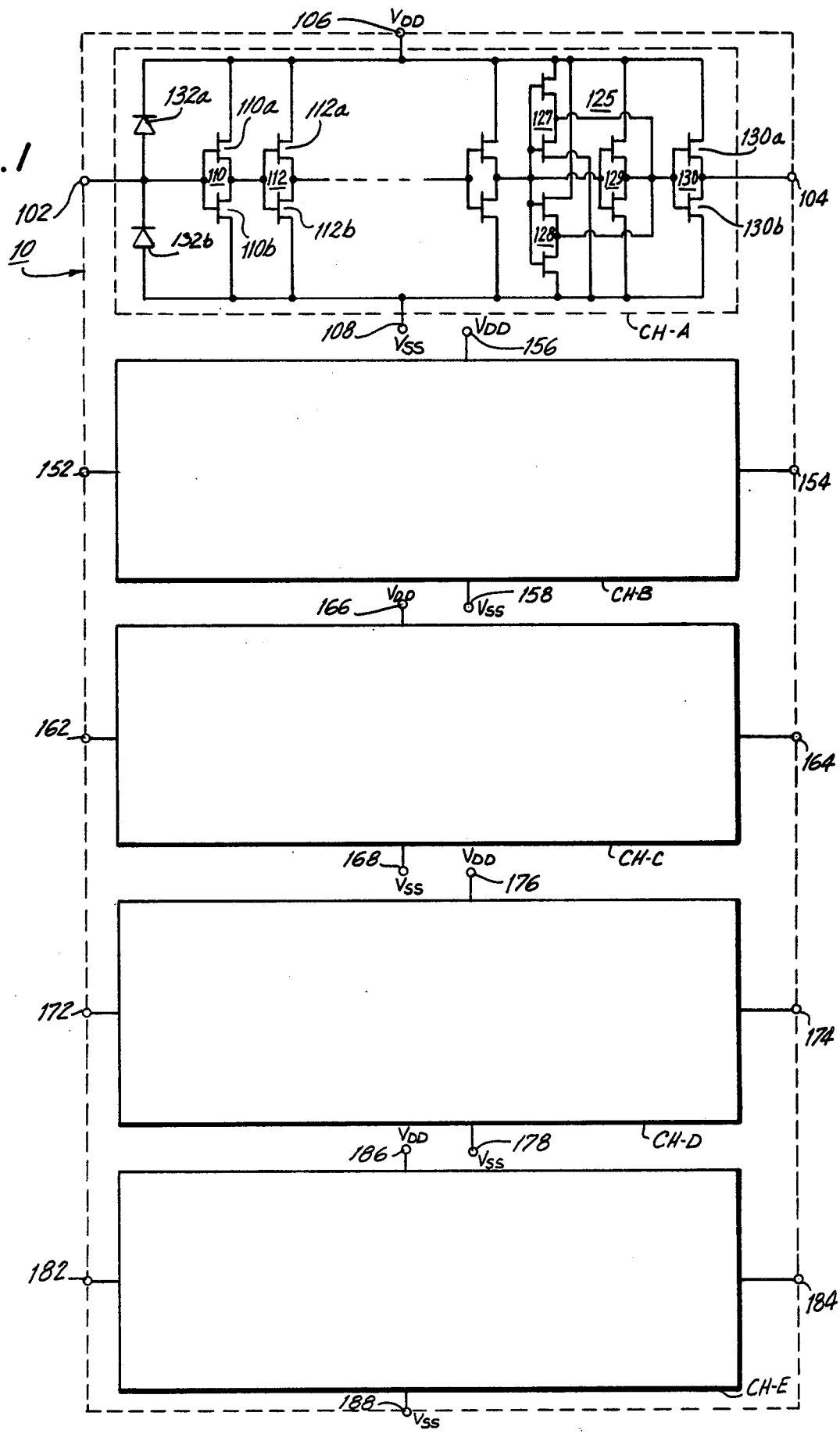
FIG. 1 is a schematic diagram of one embodiment of the programmable semiconductor delay device in accordance with the present invention.

Referring now to the drawings, wherein like reference numerals are used throughout, and in particular to FIG. 1, there is illustrated a schematic representation of one embodiment of a programmable semiconductor delay device in accordance with the present invention. In this embodiment, delay device 10 is comprised of five separate channels CH-A, CH-B, CH-C, CH-D and CH-E, each channel being formed of cascaded, directly coupled inverter elements. Each channel is of substantially identical construction and, in the interest of simplification, only channel CH-A is particularly illustrated herein.

In the example illustrated herein, channel CH-A is comprised of cascaded MOS elements, or transistor amplifiers, 110, 112, ... 125 and 130. Amplifier 110 is comprised of a pair of MOS transistors 110a and 110b, respectively, having their gate electrodes connected in common to an input terminal 102. It is appreciated that each MOS transistor 110a and 110b functions as an inverting amplifier and, for this reason, the expression "inverter element" and "amplifier element" is used interchangeably to refer thereto. Transistors 110a and 110b constitute one stage and may be complementary to each other. For example, transistor 110a may be a p-type device and transistor 110b thus would be an n-type device. The drain electrodes of transistors 110a and 110b are connected to each other. The output of element 110 is produced at this connection. The remaining elements are similarly connected and, as illustrated, successive stages are connected in cascade.

MOS element 125 is comprised of elements 127, 128 and 129, each of these elements being formed of pairs of complementary MOS transistors such as described above with respect to MOS element 110. It will be noted that, in MOS element 125, elements 127, 128 and 129 are connected in parallel. That is, the inputs, or gates, of these elements all are connected in common, and the outputs of these elements also are connected in common to output buffer stage 130.

A diode 132a is coupled in parallel with the source-gate circuit of transistor 110a, and a diode 132b is connected in parallel with the gate-source circuit of transistor 110b. The source electrodes of transistors 110a, 112a ... 130a are connected in common to a power supply terminal 106 to receive a supply voltage $V_{DD}$. Likewise, the source electrodes of transistors 110b, 112b ... 130b are connected in common to terminal 108 to receive a common, reference potential $V_{SS}$, such as ground. Terminals 106 and 108 are sometimes referred to herein as $V_{DD}$ and $V_{SS}$ terminals, respectively. Finally, the output of channel CH-A is coupled to an output terminal 104 from the junction defined by the drain electrodes of transistors 130a and 130b.

Channel CH-B is of substantially identical construction and includes an input terminal 152, an output terminal 154, a power supply terminal 156 and a common terminal 158. Channel CH-C is of substantially identical construction, and includes an input terminal 162, an output terminal 164, power supply terminal 166 and common terminal 168. Likewise, channel CH-D is of substantially identical construction, and includes input terminal 172, output terminal 174, power supply terminal 176 and common terminal 178. Finally, channel CH-E is of substantially identical construction, and includes input terminal 182, output terminal 184, power supply terminal 186 and common terminal 188.

It is appreciated that MOS elements 110 112 ... 125, 130 exhibit inherent capacitance and, because of this capacitance, each MOS element imparts an inherent delay to an input signal supplied thereto. The delay imparted by each MOS element is related to the operating voltage applied thereacross. More particularly, and with respect to MOS element 110, the delay imparted thereby is a function of the voltage across the source electrodes of transistors 110a and 110b. This is because the conducting resistance of the transistors, that is, the "ON" resistance thereof, varies as a function of the operating voltage thereacross, whereas the capacitance of these transistors is relatively constant even with operating voltage changes. Hence, the variable RC time constant of the transistors permits an adjustable delay if the operating voltage is adjustable.

If it is assumed that ground potential is supplied to common terminal 108, then the delay imparted by MOS element 110 is a function of the operating voltage $V_{DD}$ supplied to power supply terminal 106. Since successive stages of MOS elements are connected in cascade, as illustrated, it is appreciated that the overall delay imparted to an input signal by, for example, channel CH-A, is a function of the number of stages included therein, and a function of the power supply voltage $V_{DD}$. In an actual channel, the number of cascaded stages is, of course, fixed. Hence, the overall delay imparted by this channel is seen to be a function of the power supply voltage $V_{DD}$. It has been found that the delay imparted by the channel is inversely related to the operating voltage thereacross, such that, as the power supply voltage $V_{DD}$ increases, the delay imparted to the input signal by the channel decreases.

In one embodiment of the illustrated invention, each of channels CH-A ... CH-E of delay circuit 10 exhibits a time delay on the order of about 650 nsec ±20 nsec. That is, the maximum channel-to-channel delay deviation is on the order of about 40 nsec, whereby, for example, channel CH-A may exhibit a time delay of 630 nsec and channel CH-B may exhibit a time delay of about 670 nsec. This channel-to-channel delay deviation may be compensated, or minimized, as will be described below.

In the embodiment wherein each channel exhibits a time delay on the order of about 650 nsec, each channel is formed of, for example, fifty stages connected in cascade.

The overall delay imparted by a respective channel, such as channel CH-A, is determined by the power supply voltage $V_{DD}$. Preferably, although not necessarily, the power supply voltage is controlled in the range of from 4 volts to 15 volts. In this control range, the delay imparted to an input signal by channel CH-A varies from several microseconds to about 300 nsec.

If the operating voltage supplied to each of the respective power supply terminals 106, 156, 166, 176 and 186 is independent, then the delay imparted by each of the respective channels likewise will be independent, and will be determined substantially only by the magnitude of the power supply voltage $V_{DD}$ supplied thereto. Hence, each channel may function as an independent time delay circuit. However, if the power supply terminals all are connected in common, then the delays imparted by channels CH-A, CH-B, CH-C, CH-D and CH-E all will be substantially equal and will be determined by the operative voltage supplied to such common-connected power supply terminals. Of course, the aforementioned inherent channel-to-channel delay deviation of ±20 nsec for the embodiment described, may be present. Thus, with the exception of this possible deviation, the time delays exhibited by the channels all will be substantially equal to each other.

In the time delay circuit illustrated in FIG. 1, a second, or following, pulse may be propagated through a particular channel while the first, or preceding, pulse continues to propagate therethrough. Thus, two or more pulses may be propagated, or transmitted, in a channel; and each such pulse will be delayed by an amount determined by the power supply voltage $V_{DD}$. As one example, the "double pulse" resolution of the channel is on the order of about 15%. This means that two successive pulses may be propagated provided that they are separated by 15% of the total, overall delay time of that channel. With this double pulse resolution of 15%, a maximum of seven pulses may be propagated simultaneously in a particular channel. For a channel exhibiting a time delay on the order of about 650 nsec, adjacent pulses should be spaced from each other by about 100 nsec.

In accordance with the foregoing description, it is appreciated that a channel of cascaded inverters, such as MOS elements, may be designed to exhibit a time delay on the order of about 650 nsec; but the actual time delay imparted thereby is determined by the power supply voltage $V_{DD}$ supplied to the power supply terminal. Of course, as the overall time delay imparted by the channel of cascaded elements is reduced, the requisite spacing between successive pulses that may propagate therethrough likewise may be reduced. Furthermore, relatively narrow pulses may be propagated through the channel of cascaded elements. For example, if channel CH-A is supplied with a power supply voltage $V_{DD}$ such that the channel imparts a delay on the order of about 300 nsec, the pulses which propagate therethrough may exhibit a pulse width on the order of about 20 nsec. As the delay imparted by channel CH-A increases, as by reducing the power supply voltage $V_{DD}$, the pulse width of the pulses which may propagate therethrough likewise may increase.

Figure 2:
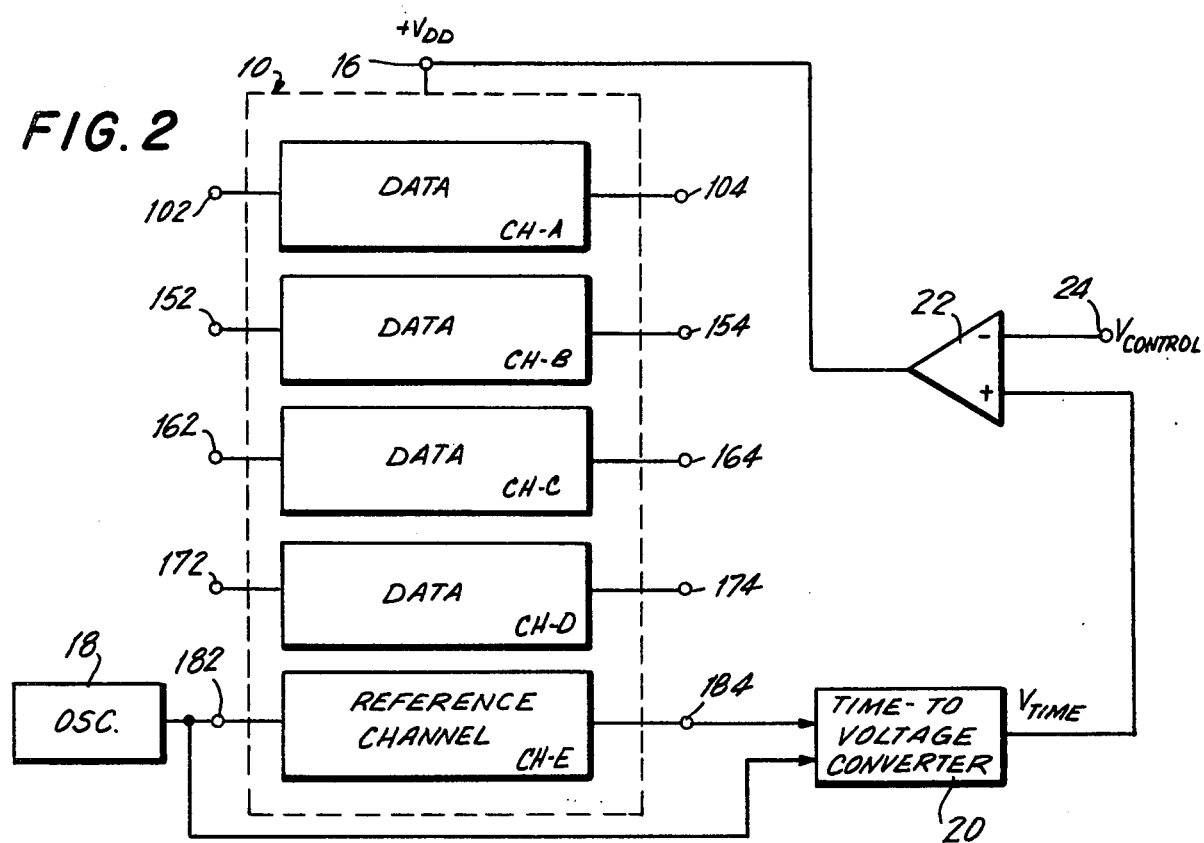
FIG. 2 is a block diagram of the programmable semiconductor delay device connected with a delay control circuit.

The manner in which the time delays imparted by each of channels CH-A, CH-B, CH-C, CH-D and CH-E are controlled, or programmed, so as to be equal to a desired time delay, now will be described with reference to FIG. 2. In FIG. 2, time delay circuit 10 is of the same construction as shown in FIG. 1. Furthermore, although not shown in FIG. 2, it will be appreciated that the power supply terminals 106, 156, 166, 176 and 186 of channels CH-A, CH-B, CH-C, CH-D and CH-E, respectively, all are connected in common to a power supply terminal 16. In addition common terminals 108, 158, 168, 178 and 188 of these channels also are connected in common and supplied with a reference potential, such as ground (not shown). For convenience, channels CH-A to CH-D are referred to as "data" channels, and channel CH-E is referred to as a "reference" channel. This means that data signals, such as data pulse signals, are delayed in channels CH-A to CH-D, and reference channel CH-E is used to control the overall delay imparted by each of the data channels.

As mentioned above, the time delay imparted by each of channels CH-A to CH-E, in response to the same power supply voltage $V_{DD}$ supplied thereto is substantially equal. Hence, a reasonably accurate indication of this time delay may be attained by measuring the time delay imparted to a reference pulse signal by, for example, reference channel CH-E. If this time delay indication differs from a desired time delay, then the power supply voltage $V_{DD}$ may be adjusted so as to change the time delays imparted by each channel until such time delays are equal to the desired time delay. The foregoing is achieved by oscillator 18, time-to-voltage converter 20 and difference amplifier 22. Oscillator 18 is coupled to input terminal 182 of reference channel CH-E and is adapted to supply reference pulses of predetermined pulse width, pulse spacing and magnitude to the reference channel. Output terminal 184 of reference channel CH-E is coupled to one input of time-to-voltage converter 20, and another input of converter 20 is coupled to oscillator 18 to receive the same reference pulse which is supplied to the reference channel. Time-to-voltage converter 20 may, for example, comprise a sawtooth generator which is triggered to commence the generation of a sawtooth voltage in response to the reference pulse supplied thereto by oscillator 18, and to terminate the sawtooth voltage in response to the delayed pulse supplied thereto by reference channel CH-E. The voltage thus attained by the time-to-voltage converter, designated $V_{time}$, is a reasonably accurate indication of the delay imparted to the reference pulse by reference channel CH-E.

The output of time-to-voltage converter 20 is coupled to one input of difference amplifier 22, the other input thereof being coupled to a terminal 24 to receive a voltage $V_{control}$ representing a desired time delay. Difference amplifier 22 is adapted to produce an output voltage representing the difference between $V_{time}$ and $V_{control}$. In one embodiment, the non-inverting input of difference amplifier 22 is coupled to the output of time-to-voltage converter 20, and the inverting input of the difference amplifier is coupled to terminal 24. In an alternative embodiment, these connections are interchanged. The output of difference amplifier 22 is coupled to a power supply terminal 16 and functions to change, or modify, the power supply voltage $V_{DD}$ as a function of the detected difference between $V_{time}$ and $V_{control}$. In one embodiment, the output voltage produced by difference amplifier 22 may be supplied directly as the power supply voltage $V_{DD}$. In another embodiment, the output of difference amplifier 22 is combined, as by being mathematically added to or subtracted from, power supply voltage $V_{DD}$.

In operation, let it be assumed that the time delay imparted by each of data channels CH-A to CH-D is desired to be on the order of about 650 nsec. Accordingly, reference voltage $V_{control}$ is supplied to difference amplifier 22, the magnitude of this reference voltage $V_{control}$ being representative of a time delay equal to 650 nsec.

Oscillator 18 generates a reference pulse which is supplied to reference channel CH-E and, simultaneously, triggers time-to-voltage converter 20. As the reference pulse propagates through reference channel CH-E, the time-to-voltage converter generates a gradually increasing sawtooth voltage $V_{time}$. Finally, when the reference pulse is provided at output terminal 184 of reference channel CH-E, time-to-voltage converter 20 is inhibited, resulting in the output voltage $V_{time}$ whose magnitude represents the propagation delay of this reference pulse. That is, the voltage $V_{time}$ represents the actual time delay imparted by reference channel CH-E. As mentioned above, all of the channels of delay circuit 10 exhibit substantially the same time delay. Hence, the voltage $V_{time}$ represents the actual time delay of each of channels CH-A to CH-E.

In accordance with one embodiment, let it be assumed that the output voltage produced by difference signal 22 is supplied to power supply terminal 16 directly as the power supply voltage $V_{DD}$. If the delay imparted by reference channel CH-E is substantially equal to the desired delay, which has been assumed herein to be on the order of about 650 nsec, then the difference $\Delta V$ between the actual and desired time delays ($\Delta V = V_{time} - V_{control}$) will be such that the output voltage $V_{DD}$ produced by difference amplifier 22 is equal to the operating voltage by which each channel imparts a time delay equal to the desired time delay (e.g. 650 nsec). However, if the actual time delay imparted by reference channel CH-E is less than the desired time delay, then the voltage $V_{time}$ will be correspondingly reduced, and the difference between the actual and desired time delays $\Delta V$ also will be reduced. Hence, the power supply voltage $V_{DD}$ produced at the output of difference amplifier 22 will decrease, thereby increasing the time delay imparted by each of channels CH-A to CH-E.

Conversely, if the time delay imparted by reference channel CH-E is greater than the desired time delay, the voltage $V_{time}$ generated by time-to-voltage converter 20 will be relatively higher. Hence, the difference between the actual and desired time delays $\Delta V$ will be increased, thereby increasing the power supply voltage $V_{DD}$ produced at the output of difference amplifier 22. As a result of this increase in the operating voltage supplied to each of channels CH-A to CH-E, the time delays imparted thereby will be correspondingly reduced.

Thus, it is appreciated that, in accordance with the feedback control circuit illustrated in FIG. 2, the time delay imparted to, for example, data signals supplied to each of data channels CH-A to CH-D may be controlled to be equal to a desired time delay, the latter being represented by reference voltage $V_{control}$. Therefore, even if the cascaded elements which comprise each channel exhibit temperature-dependent characteristics, the time delays imparted by the respective channels may, nevertheless, be maintained constant in the environment of changing temperatures. This constant time delay is achieved by supplying a constant, temperature-independent reference voltage $V_{control}$ to difference amplifier 22. Even as the inherent time delay of, for example, reference channel CH-E changes as a function of a change in temperature, this change will be compensated by the illustrated feedback control circuit.

Thus, power supply voltage $V_{DD}$ is modified so as to correspondingly change the time delays imparted by the illustrated channels, thereby establishing a desired time delay therein.

It is appreciated that, in particular applications wherein several delay circuits 10 are provided, the delays imparted by the respective data channels in each circuit, that is, the delays imparted by each data channel which is formed on each integrated circuit chip, all may be made equal to each other. This is achieved by supplying the same reference voltage $V_{control}$ to a corresponding difference amplifier 22 in each feedback control circuit for each integrated circuit chip if process variations warrant it. Thus, the time delay imparted by each data channel in each integrate circuit chip will be made equal to the time delay represented by the reference voltage $V_{control}$.

Figure 3:
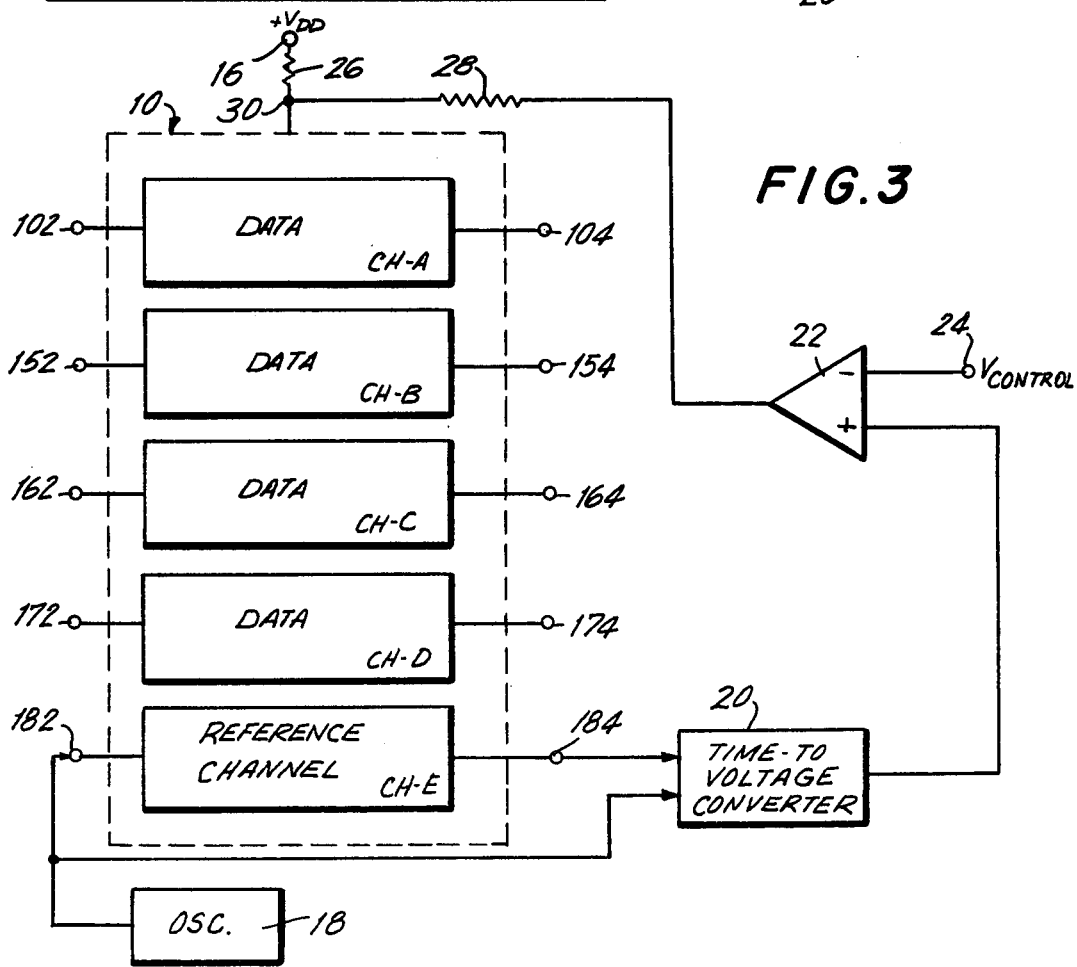
FIG. 3 is a block diagram of another embodiment of the programmable semiconductor delay device connected with a delay control circuit.

FIG. 3 is a schematic diagram of yet another embodiment of the feedback control circuit which is used to control the time delays of the respective channels of delay circuit 10. The embodiment of FIG. 3 differs from that shown in FIG. 2 in that the output of difference amplifier 22 is mathematically combined with power supply voltage $V_{DD}$ by resistors 26 and 28. In particular, the power voltage $V_{DD}$ is coupled to a junction 30 via resistor 26, and the output of difference amplifier 22 is coupled to this junction via resistor 28. Resistors 26 and 28 function as a mathematic combining circuit to subtract from or add to power supply voltage $V_{DD}$ the output of the difference amplifier. It is recalled that the output voltage $\Delta V$ of difference amplifier 22 represents the difference between the actual and desired time delays of reference channel CH-E. Resistors 26 and 28 function to modify the operating voltage $V_{DD}$ with difference voltage $\Delta V$. Hence, if the actual delay of reference channel CH-E is less than the desired delay, the output voltage $\Delta V$ may be of negative polarity and is subtracted from the operating voltage $V_{DD}$, thereby reducing the power supply voltage at each of the channels. Consequently, the time delay imparted by such channels is increased. Conversely, if the time delay of reference channel CH-E is greater than the desired time delay, the difference voltage $\Delta V$ may be of positive polarity and functions to increase the power supply voltage that is supplied to the respective channels, thereby reducing the time delays therein.

Figure 4:
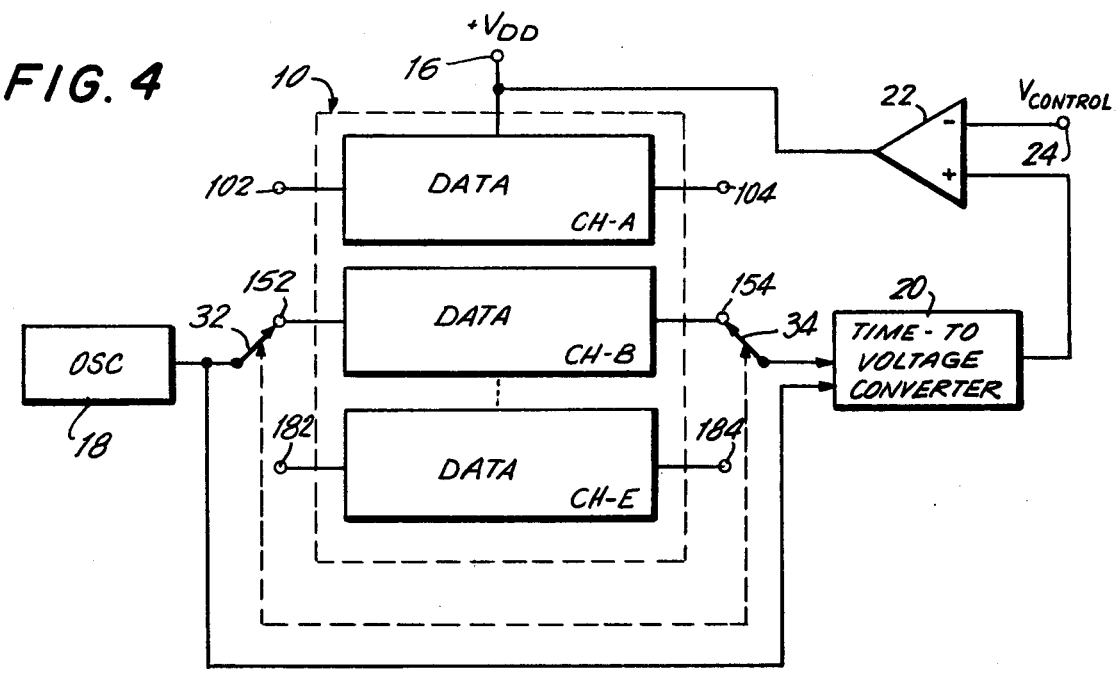
FIG. 4 is a block diagram of the programmable semiconductor delay device, and represents that any channel included therein may be arbitrarily selected as a reference channel, for a purpose to be described.

In FIGS. 2 and 3, channel CH-E has been designated the reference channel. However, it is not necessary to assign a specific one of channels CH-A to CH-E as being the reference channel for purposes of determining the actual time delay imparted by the channels of delay circuit 10. FIG. 4 illustrates another embodiment by which any one of channels CH-A to CH-E may be designated the "reference channel". FIG. 4 differs from the embodiment shown in FIG. 2 by the addition of selector switches 32 and 34. These selector switches are seen to be ganged for simultaneous operation, and selector switch 32 selects a particular channel to which a reference pulse generated by oscillator 18 is supplied; and switch 34 is adapted to be connected to the output terminal of that same channel so as to supply the delayed pulse which propagates therethrough to time-to-voltage converter 20. When the appropriate data channel has been selected as the "reference channel", the embodiment shown in FIG. 4 operates in substantially the identical manner as was described hereinabove with respect to the embodiment of FIG. 2.

Figure 5:
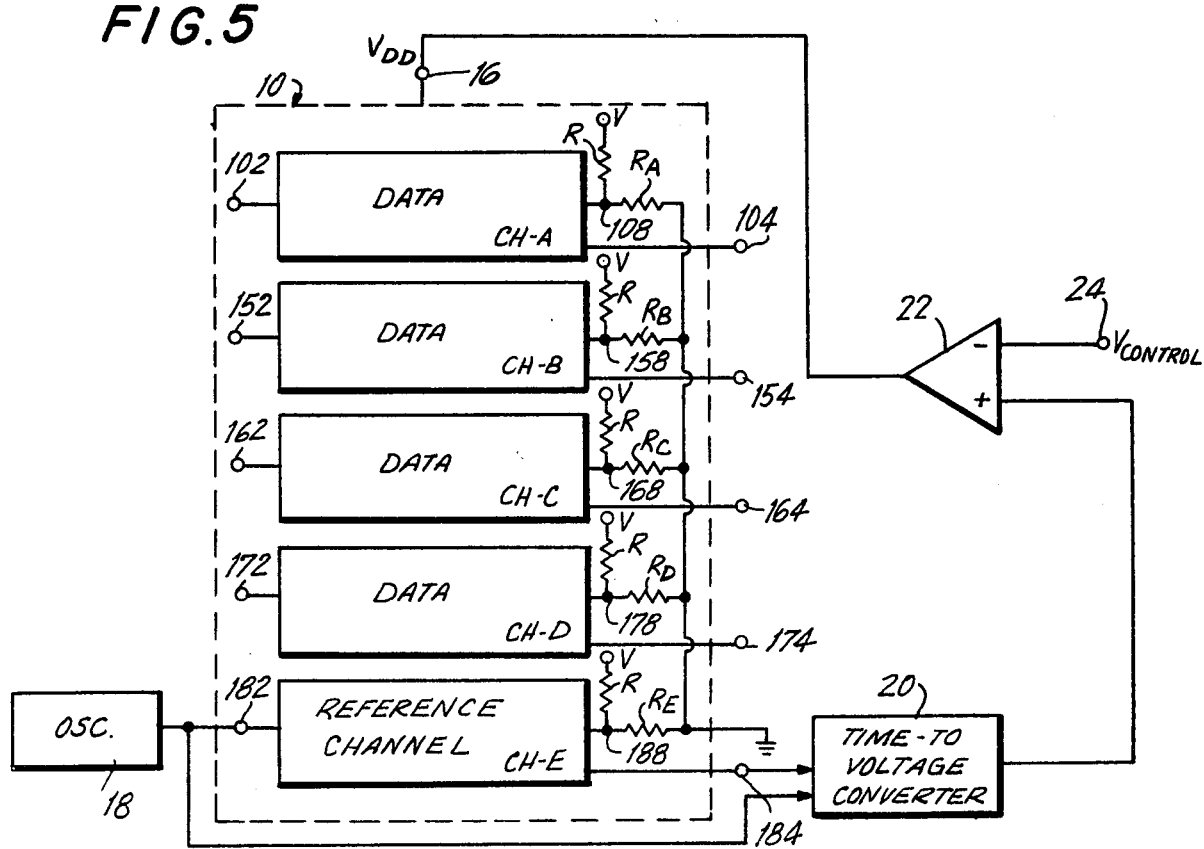
FIG. 5 is a block diagram of another embodiment of the programmable semiconductor delay device.

As mentioned above, although channels CH-A to CH-E all may be formed on a single, semiconductor integrated circuit chip, a channel-to-channel delay deviation may be present. For a time delay circuit exhibiting a channel delay time on the order of about 650 nsec, this channel-to-channel deviation may be on the order of about +20 nsec. The embodiment shown in FIG. 5 illustrates one technique by which this channel-to-channel delay deviation may be minimized and, preferably, eliminated. In FIG. 5, the $V_{SS}$ terminal of each channel is supplied with a DC potential which may differ from ground by connecting a respective voltage divider thereto. This voltage divider is formed of a resistor R, having the same resistance value for each voltage divider, and a respective resistor $R_A$, $R_B$ ... $R_E$ having a corresponding resistance value. Each voltage divider is connected between a source of DC voltage V and ground, resulting in a DC potential of $$\frac{R_x}{R + R_x} V$$

supplied to $V_{SS}$ terminals 108, 158, 168, 178 and 188, respectively, where $R_x=R_A$ for channel CH-A, $R_x=R_B$ for channel CH-B and $R_x=R_C$, $R_D$ or $R_E$ for channels CH-C, CH-D and CH-E, respectively. Each of these resistors may be of a unique resistance value so as to reduce the effective operating voltage supplied from its respective power supply terminal $V_{DD}$ across that channel. Thus, the operating voltage supplied across channel CH-A will be reduced from power supply voltage $V_{DD}$ by an amount which is a function of the DC potential supplied to $V_{SS}$ terminal 108 by the voltage divider which includes resistor $R_A$. Likewise, the operating voltage supplied across channel CH-B will be reduced from the power supply voltage $V_{DD}$ by an amount which is a function of the DC potential supplied to $V_{SS}$ terminal 158 by the voltage divider which includes resistor $R_B$. Consequently, the actual operating voltage which is supplied across each data channel is a function of the resistance of the particular resistor $R_A$ ... $R_E$ connected thereto. These resistors act as "trim" resistances, whereby the actual operating voltage supplied across each channel results in substantially equal time delays exhibited thereby. Thus, these "trim" resistors serve to compensate, or "trim", the channel-to-channel delay deviation noted hereinabove. For example, if the inherent delay imparted by channel CH-A is less than the inherent delay imparted by channel CH-B, the voltage supplied to $V_{SS}$ terminal 108 will be more positive than the voltage supplied to $V_{SS}$ terminal 158 by reason of the different resistance values of resistors $R_A$ and $R_B$, resulting in a reduction in the operating voltage across channel CHso as to increase the fime delay of that channel. Thus, channels CH-A and CH-B will exhibit practically identical time delays. Of course, the feedback control circuit illustrated in FIG. 5 functions in substantially the same way as the feedback control circuit described hereinabove with respect to FIG. 2.

Figure 6:
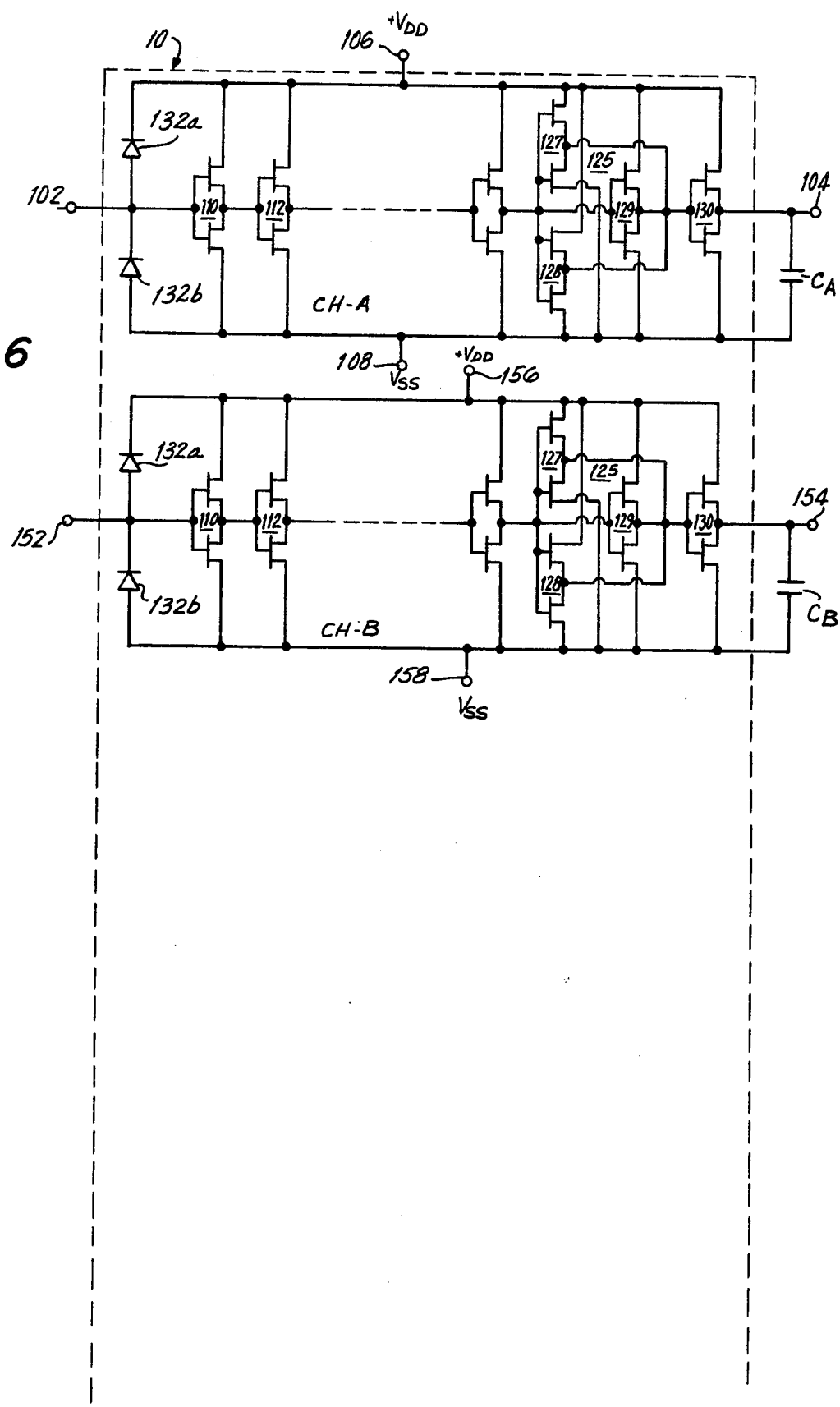
FIG. 6 is a schematic diagram of a still further embodiment of the programmable semiconductor delay device.

In FIG. 5, resistors $R_A$–$R_E$ function as adjusting elements to adjust the DC voltages supplied to the respective $V_{SS}$ terminals of channels CH-A to CH-E, respectively. Alternative adjusting elements are illustrated in FIG. 6. FIG. 6 illustrates schematically the construction of each of channels CH-A and CH-B, as examples. It is recognized that these constructions are identical to that described hereinabove with respect to FIG. 1. However, in the FIG. 6 embodiments, additional capacitive elements are connected to the outputs of the respective channels. For example, in channel CH-A, a capacitive element $C_A$ is connected between output terminal 104 and $V_{SS}$ terminal 108. In channel CH-B, a capacitive element $C_B$ is connected between output terminal 154 and $V_{SS}$ terminal 158. It is appreciated that, although not shown in FIG. 6, similar additional capacitance elements $C_C$ to $C_E$ may be connected to the output terminals of channels CH-C to CH-E, respectively.

The additional capacitance elements serve to increase the delays imparted by the particular channels in which the respective additional capacitance elements are provided. By selecting the appropriate capacitance values of such additional capacitance elements, the additional delay of each channel may be selectively increased such that all of the channels exhibit equal time delays.

In the embodiment of FIG. 6 additional capacitance elements are illustrated as being connected to each of the output terminals in each channel. If preferred, an additional capacitance element may be provided in only one of the plural channels provided on each integrated circuit chip. For example, the additional capacitance element may be provided in the channel having the shortest inherent time delay. Such an additional capacitance element may exhibit a capacitance value so as to increase this time delay to be equal to the largest, or any other, time delay of the channels formed on the integrated circuit chip.

While the present invention has been particularly shown and described with reference to certain preferred embodiments, it will be readily appreciated by those of ordinary skill in the art that various changes and modifications in form and details may be made without departing from the spirit and scope of the invention. For example, a greater or lesser number of channels may be formed on each integrated circuit chip. As mentioned above, any desired one of the channels may be selected as the reference channel for use with the feedback control circuit so as to establish a desired time delay for that and all of the remaining channels. Advantageously, the feedback control circuit may be formed as an integrated circuit on the very same integrated circuit chip as the respective channels. Moreover, each channel may be formed of a desired number of cascaded MOS elements so as to establish a desired time delay which, as mentioned above, is a function of the number of such cascaded elements. Still further, any inherent channel-to-channel delay deviation may be minimized, or removed, in accordance with the embodiment illustrated in FIGS. 5 and 6 wherein adjusting elements are provided either to selectively adjust the operating voltage supplied across each channel (as in FIG. 5), or to selectively adjust the overall delay imparted by such channels (as in FIG. 6).

In the feedback control circuit, one example of a time-to-voltage converter has been described previously. It will be recognized that other circuits may be designed by those of ordinary skill in the art which are equivalent to, and perform the same function as, the aforedescribed time-to-voltage converter. For example, a digital timing circuit may be used, in conjunction with a digital-to-analog converter as the time-to-voltage converter. Preferably, in the embodiment described hereinabove, the output voltage $V_{time}$ produced by the time-to-voltage converter remains substantially constant until the converter is triggered to carry out a succeeding operation in response to another reference pulse supplied thereto by oscillator 18.

In the embodiments shown in FIGS. 1 and 6, each of the cascaded elements may be formed as complementary MOS transistor amplifiers, or as MOS transistor amplifiers connected in cascode, as desired. Likewise, MOS element 125 may adopt the configuration illustrated herein or, alternatively, may be formed simply as complementary or cascoded MOS transistor amplifiers, similar to MOS elements 110, 112, ... 129.

The cascaded elements need not be limited to MOS transistor amplifiers or inverters. As an alternative, each channel may be comprised of cascaded integrated injector logic ($I^2L$) elements. When $I^2L$ elements are used, the voltage supplied to the injector device is controlled, thereby controlling the magnitude of the currect injected therefrom into the inverter device. Since the injected current magnitude determines the value of the "ON" resistance of the inverter device, an adjustment in the injector device supply voltage results in a corresponding adjustment in the inverter resistance so as to vary the RC time constant, or delay, of the $I^2L$ element. As a further alternative, each channel may be comprised of cascaded ECL inverters whose inherent time delays are controlled by the power supply voltage applied thereto. Still further, a number of the aforementioned channels of MOS, $I^2L$ or ECL elements may be connected in series, with a switching circuit connected to select the number of series-connected channels to be used. This establishes a "coarse" time delay with "fine" adjustments being made in the manner described above with respect to the illustrated embodiments.

It is intended that the appended claims be interpreted as including the foregoing as well as various other changes and modifications.

What is claimed is:

1. A programmable delay circuit comprising a channel of cascaded, directly coupled inverter elements; a power supply terminal coupled to said channel for supplying an operating voltage to said inverter elements; a source of operating voltage coupled to said power supply terminal; and modifying means for modifying said operating voltage to establish a desired time delay exhibited by said channel as a function of the magnitude of the operating voltage supplied to said power supply terminal; said modifying means comprising voltage generating means for generating a voltage representing the actual time delay exhibited by said channel; means for supplying a reference voltage representing said desired time delay; and comparison means for comparing said generated and reference voltages and for adjusting the operating voltage supplied to said power supply terminal as a function of the difference therebetween.

2. A programmable delay circuit comprising a channel of cascaded, directly coupled inverter elements; a power supply terminal coupled to said channel for supplying an operating voltage to said inverter elements; a source of operating voltage coupled to said power supply terminal; and modifying means for modifying said operating voltage to establish a desired time delay exhibited by said channel as a function of the magnitude of the operating voltage supplied to said power supply terminal; and further comprising at least one additional channel of cascaded inverter elements, said at least one additional channel having a power supply terminal for supplying an operating voltage to the inverter elements therein, said power supply terminal being connected in common with the first-mentioned power supply terminal to receive the same operating voltage.

3. The circuit of claim 2, further comprising adjusting means connected in series with at least selected ones of said power supply terminals to adjust the operating voltage supplied thereto substantially independently of said modifying means.

4. The circuit of claim 3 wherein said adjustment means comprise respective resistances connected to said selected power supply terminals.

5. The circuit of claim 2 wherein each of said cascaded inverter elements comprises an MOS transistor amplifier; and wherein selected ones of said channels include an additional MOS capacitance element to increase the time delay exhibited by said selected channels.

6. A programmable semiconductor delay device comprising a plurality of data channels and a reference channel, each channel including a plurality of cascaded semiconductor amplifier elements, an input terminal for receiving an input signal, an output terminal for providing a delayed signal, and a power supply input for receiving an operating voltage; detecting means for detecting the actual time delay imparted to an input signal by said reference channel; means for receiving a signal representing a desired time delay; sensing means for sensing the difference between the actual time delay exhibited by said reference channel and said desired time delay; and voltage modifying means for modifying the operating voltage supplied in common to all of said power supply inputs as a function of the sensed difference between said actual and desired time delays, thereby making the time delay exhibited by each said channel conform substantially to said desired time delay.

7. The device of claim 6 wherein said detecting means comprises time-to-voltage converting means coupled to the output terminal of said reference channel for generating a voltage proportional to the time for a reference signal supplied to the input terminal of said reference channel to propagate therethrough.

8. The device of claim 7 wherein said signal representing a desired time delay is a voltage representative thereof; and wherein said sensing means comprises difference means for producing a difference voltage as a function of the difference between the voltage generated by said time-to-voltage converting means and the voltage representing said desired time delay.

9. The device of claim 8 wherein said voltage modifying means comprises feedback means for feeding back said difference voltage to modify the operating voltage supplied to said power supply inputs.

10. The device of claim 6 further comprising operating voltage adjustment means connected to the power supply input of each of at least some of said channels to adjust the operating voltage supplied to said some channels substantially independently of an adjustment to the operating voltage supplied to another channel and thereby trim a difference between the inherent time delay exhibited by said some channels and the inherent time delay exhibited by another channel.

11. The device of claim 10 wherein said operating voltage adjustment means comprises respective resistances connected in series with the power supply inputs of said some channels for reducing the operating voltages supplied to said some channels.

12. The device of claim 6 further comprising additional delay means connected in at least one of said channels to increase the time delay exhibited by said at least one channel and thereby trim a difference between the inherent time delay exhibited by said at least one channel and the inherent time delay exhibited by another channel.

13. The device of claim 12 wherein said additional delay means comprises a capacitance.

14. The device of claim 13 wherein said capacitance is connected to the output terminal of said at least one channel.

15. The device of claim 6 wherein said semiconductor amplifier elements comprise MOS transistor amplifiers.

16. The device of claim 15 wherein said data and reference channels are formed on a single semiconductor chip.

* * * * *